United States Patent [19]
Kitao

[11] Patent Number: 6,081,889
[45] Date of Patent: Jun. 27, 2000

[54] METHOD OF RESETTING A SYSTEM

[75] Inventor: Ichiro Kitao, Kanagawa, Japan

[73] Assignee: NEC Corporation, Tokyo, Japan

[21] Appl. No.: 09/100,817

[22] Filed: Jun. 19, 1998

[30] Foreign Application Priority Data

Jun. 25, 1997 [JP] Japan .................................. 9-168222

[51] Int. Cl.[7] .................................................. G06F 1/24
[52] U.S. Cl. .................................................... 713/1
[58] Field of Search ............................... 713/1, 500, 100

[56] References Cited

U.S. PATENT DOCUMENTS 5,923,838  7/1999  Hongo ........................................ 714/42
5,925,139  7/1999  Yamada et al. ............................ 714/14

FOREIGN PATENT DOCUMENTS 2-210515  8/1990  Japan .

Primary Examiner—Thomas M. Heckler
Attorney, Agent, or Firm—Scully, Scott, Murphy & Presser

[57] ABSTRACT

A method of resetting a system enables an EEPROM writing to be implemented to the end normally, and it is capable of avoiding runaway of the whole system, even if reset signal is received because of a power failure while the EEPROM is in the writing state. In the system which has a CPU, an EEPROM whole circuit, an oscillation circuit, and a reset control circuit, when a system reset occurs, the method includes detecting a writing operation of the EEPROM cell, in cases where the EEPROM cell is implementing the writing operation, holding the reset of the EEPROM cell until the writing operation of the EEPROM cell is terminated, thus implementing the reset of at least the CPU.

5 Claims, 10 Drawing Sheets

F I G. 6
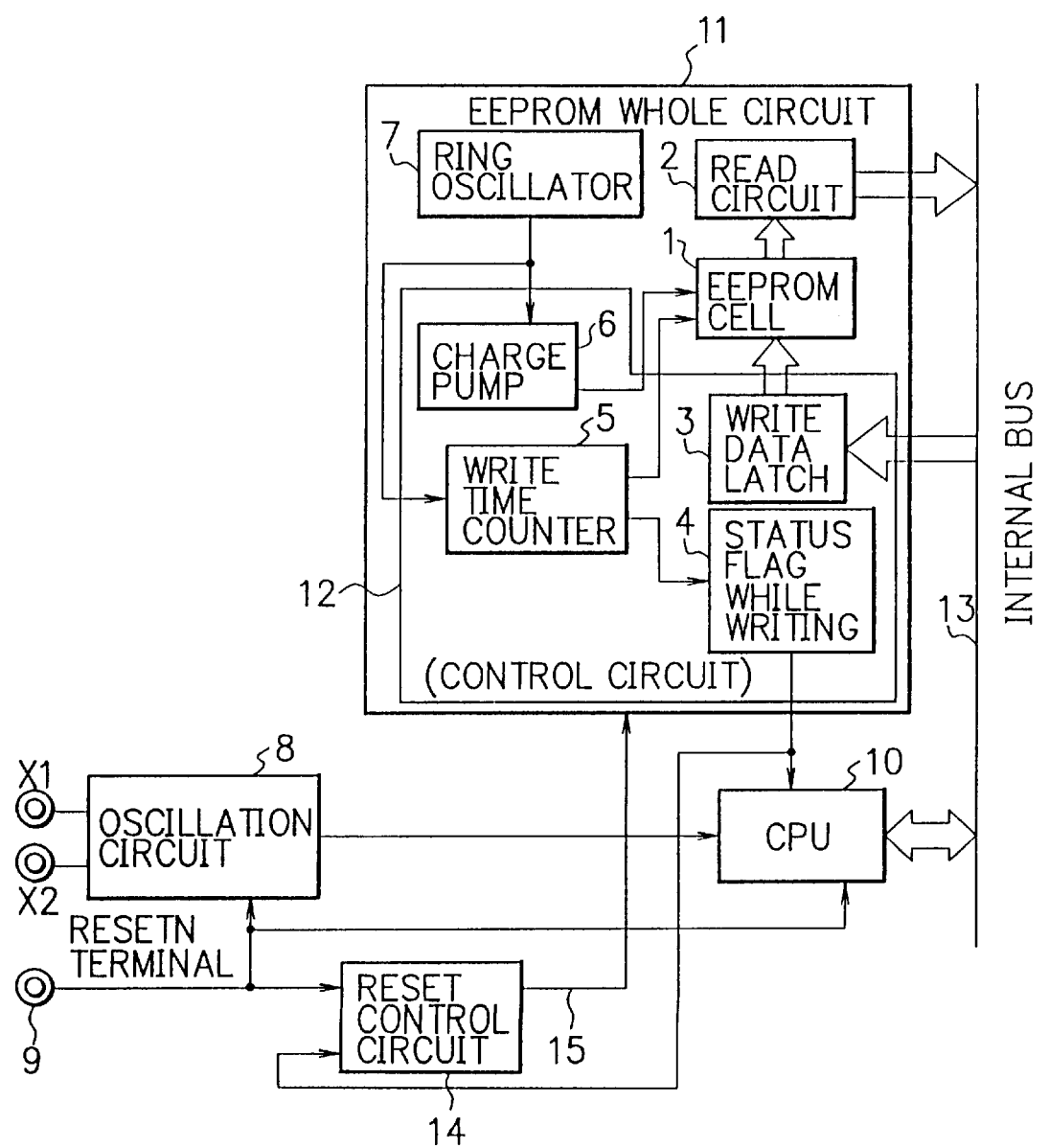

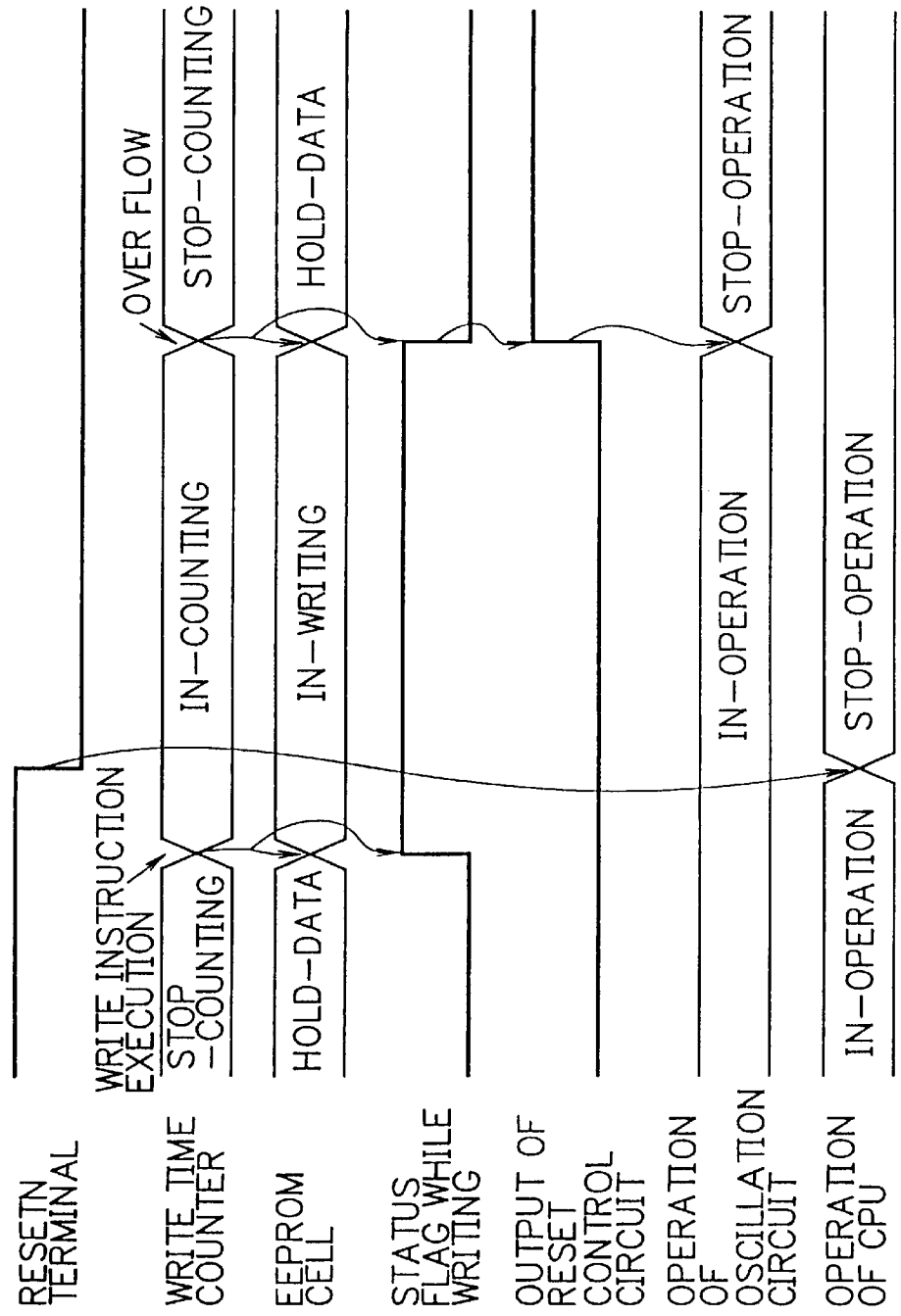

METHOD OF RESETTING A SYSTEM

BACKGROUND OF THE INVENTION

The present invention relates to a method of resetting a system. More particularly this invention relates to a method of resetting a system in which the resetting is executed while an EEPROM (electrically erasable programmable read-only memory) is in the writing state.

DESCRIPTION OF THE PRIOR ART

FIG. 1 is a view showing a resetting method (without a resetting control circuit) of a conventional system. The resetting method as shown in FIG. 1 comprises an EEPROM whole circuit 11, an oscillation circuit 8, a CPU 10, and a RESETN terminal 9.

The EEPROM whole circuit 11 includes a ring oscillator 7, a read-out circuit 2, an EEPROM cell 1, and a control circuit 12. Further the control circuit 12 includes a charge pump 6, write time counter 5, a write data latch 3, and a status flag-while writing 4.

FIG. 2 is a timing chart of the resetting method of FIG. 1. Operation is described referring to FIGS. 1 and 2. When the EEPROM write instruction is executed, data of an internal bus 13 is latched within the write data latch 3. Further the write time counter 5 starts counting. Simultaneously the ring oscillator 7 starts oscillation.

The value of the internal bus 13 is latched within the write data latch 3, before a writing operation of the value of the write data latch 3 to the EEPROM cell 1 is started. After the data is latched to the write data latch 3, the writing is executed without reference to the CPU 10. The charge pump 6 generates the voltage which is necessary for the writing of the EEPROM cell 1 depending on the clock from the ring oscillator 7. The status flag-while writing 4 outputs HIGH-LEVEL during the period when the write time counter 5 is operating, thus exhibiting that the EEPROM cell 1 is in the writing state.

When the reset signal is taken in from the RESETN terminal 9 while the EEPROM cell 1 is in the writing state, the reset operates on the EEPROM whole circuit 11, thus causing the write time counter 5 to stop the counting so that writing of the EEPROM cell 1 is interrupted. As a result thereof the value of the EEPROM cell 1 becomes undefined. Then the status flag-while writing 4 outputs LOW-LEVEL.

Further, the reset operates on both of the oscillation circuit 8 and the CPU 10, to stop operation. When executing the EEPROM read-out instruction after removing of the resetting, the CPU 10 is obliged to read the undefined state of the EEPROM cell 1 through the read-out circuit 2 and the internal bus 13.

FIG. 3 is a view showing a conventional resetting method (with a resetting control circuit) of the system. The resetting method shown in FIG. 3 comprises an EEPROM whole circuit 11, an oscillation circuit 8, a CPU 10, a RESETN terminal 9, and a reset control circuit 14.

The EEPROM whole circuit 11 includes a ring oscillator 7, a read-out circuit 2, an EEPROM cell 1, and a control circuit 12. Further, the control circuit 12 includes a charge pump 6, a write time counter 5, a write data latch 3 and a status flag-while writing 4.

FIG. 4 is a timing chart of the resetting method of FIG. 3. Operation is described referring to FIGS. 3 and 4. When the EEPROM write instruction is executed, the data of the internal bus 13 is latched within the write data latch 3. Further, the write time counter 5 starts counting. Simultaneously, the ring oscillator 7 starts oscillation.

The value of the internal bus 13 is latched within the write date latch 3, before starting the writing operation of the value of the write data latch 3 to the EEPROM cell 1. After the data is latched within the write data latch 3, the writing is implemented without reference to the CPU 10. The charge pump 6 generates the voltage necessary for the writing of the EEPROM cell 1 depending on the clock from the ring oscillator 7. The status flag-while writing 4 outputs HIGH-LEVEL during the period when the write time counter 5 is operating, thus exhibiting that the EEPROM cell 1 is in the writing state.

When taking in the reset signal from the RESETN terminal 9 while the EEPROM cell 1 is in the writing state, the reset does not operate on the EEPROM whole circuit 11, the CPU 10, and the oscillation circuit 8, because the status flag-while writing 4 is of the HIGH-LEVEL, thus the output 15 of the reset control circuit 14 maintains LOW-LEVEL. When the counting of the write time counter 5 is completed, the writing of the EEPROM cell 1 ends, thus the status flag-while writing 4 comes into LOW-LEVEL. When the status flag-while writing 4 comes into LOW-LEVEL, the output 15 of the reset control circuit 14 comes into HIGH-LEVEL, the reset operates on the EEPROM whole circuit 11, the CPU 10, and the oscillation circuit 8. When the reset operates on the EEPROM whole circuit 11, since the writing of the EEPROM cell 1 is already completed, the value of the internal bus 13 is normally stored in the EEPROM cell 1.

When the EEPROM read instruction is executed after removal of the reset, it is capable of reading the normal value of the EEPROM cell 1 by the CPU 10 through the read-out circuit 2 and the internal bus 13.

FIG. 5 is a view showing an internal configuration of the communication processing device disclosed in the Japanese Patent Application Laid-Open No. 2-210515. The communication processing device shown in FIG. 5 comprises a processor (arithmetic processing section) 31, a processor (bus interface) 32, a processor (circuit control section) 34, a control circuit 40, a storing circuit 33, a reset control circuit 38 and a switch 37.

The control circuit 40 controls read/write of the storing device 33 by the processor (arithmetic processing section) 31, the processor (bus interface) 32, and the processor (circuit control section) 34.

The reset control circuit 38 detects whether or not the storing device 33 is in the writing state according to the condition of the memory start signal s and the memory access completion signal f. When the storing device is in the writing state, the reset control circuit 8 reserves the save reset signal sr although the reset signal comes into active state, thus causing the save reset signal sr to be active after completion of the write of the storing device 33.

The holding-reset within the system is executed due to this save reset signal sr. The explanation of the switch 37 and the initial diagnostic reset signal ir are omitted because their description is unnecessary, to the understanding of the present invention.

The resetting method of the system of FIG. 3 has the same way of operating as that of FIG. 5.

In the conventional resetting method (without resetting control circuit) of the system shown in FIG. 1, although the writing of the EEPROM is during execution, the EEPROM whole circuit 11, and the oscillation circuit 8 are affected by the reset due to the reset signal from the RESETN terminal 9. Consequently, when the reset occurs during writing to the EEPROM cell 1, the data of the EEPROM cell 1 comes into an undefined state while being interrupted in writing of the EEPROM. Subsequently, there is the problem that when the EEPROM read-out instruction is executed after removing of the reset, the CPU 10 is obliged to read the undefined state of the EEPROM cell 1.

In the conventional resetting method (with resetting control circuit) of the system shown in FIG. 3 and the communication processing device disclosed in the Japanese Patent Application Laid-Open No. HEI 2-210515, the countermeasure which causes the reset to be held until write of the EEPROM is completed is shown, however when the reset signal from the RESETN terminal 9 is received while the EEPROM is in the writing state by the reset occurring because of a power failure, the whole reset is obliged to hold until writing of the EEPROM is completed by the reset control circuit 14. The CPU 10 or the oscillation circuit 8 are not affected by the reset, the CPU 10 or the oscillation circuit 8 implements abnormal operation. Thus there is the problem that dangerousness of the runaway of the whole system may occur.

SUMMARY OF THE INVENTION

In view of the foregoing, it is an object of the present invention to provide a method for resetting a system in which when the reset signal is received because of a power failure while the EEPROM is in the writing state, the resetting method enables the EEPROM writing to be implemented normally to the end, and enables runaway of the whole system to be avoided.

In one arrangement to be described below by way of example in illustration of the invention, a method of resetting a system includes a CPU, a storing device, an oscillation circuit and a reset control circuit, the reset method comprising the steps of detecting a writing operation of said storing device at the time when a system reset occurs by means of the reset control circuit, and holding a reset of the storing device until the writing operation of the storing device is terminated when the storing device is implementing the writing operation, thus implementing at least reset of said CPU.

The above and further objects and novel features of the invention will be more fully understood from the following detailed description when the same is read in connection with the accompanying drawings. It should be expressly understood, however, that the drawings are for purpose of illustration only and are not intended as a definition of the limits of the invention.

BRIEF DESCRIPTION OF THE DRAWINGS

FIG. 6 is a block diagram showing a first embodiment of a resetting method of the present invention;

FIG. 10 is a timing chart showing operation of the second embodiment.

DETAILED DESCRIPTION OF THE PREFERRED EMBODIMENTS

Figure 1:
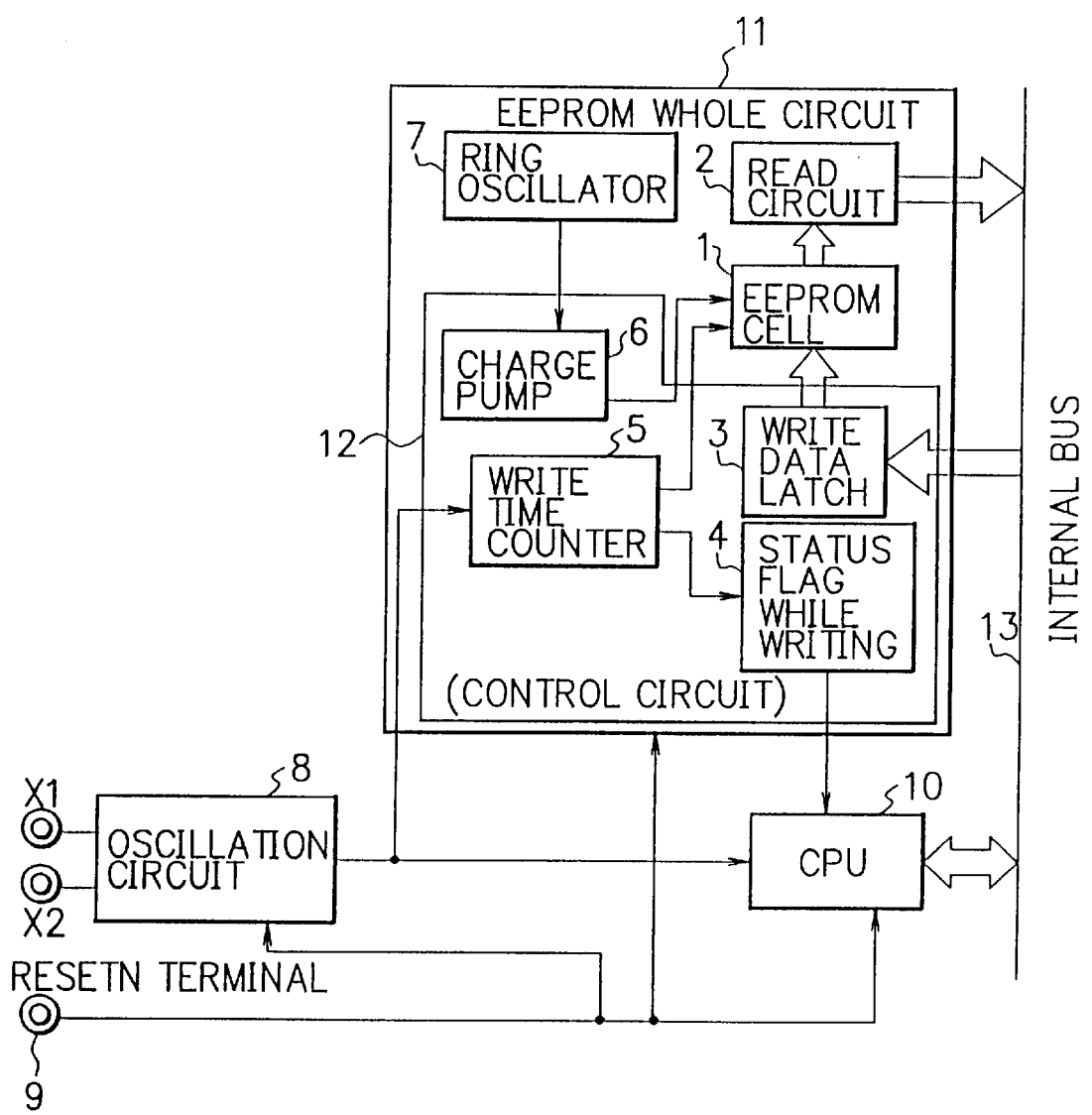
FIG. 1 is a block diagram showing a conventional method of resetting a system.
Figure 2:
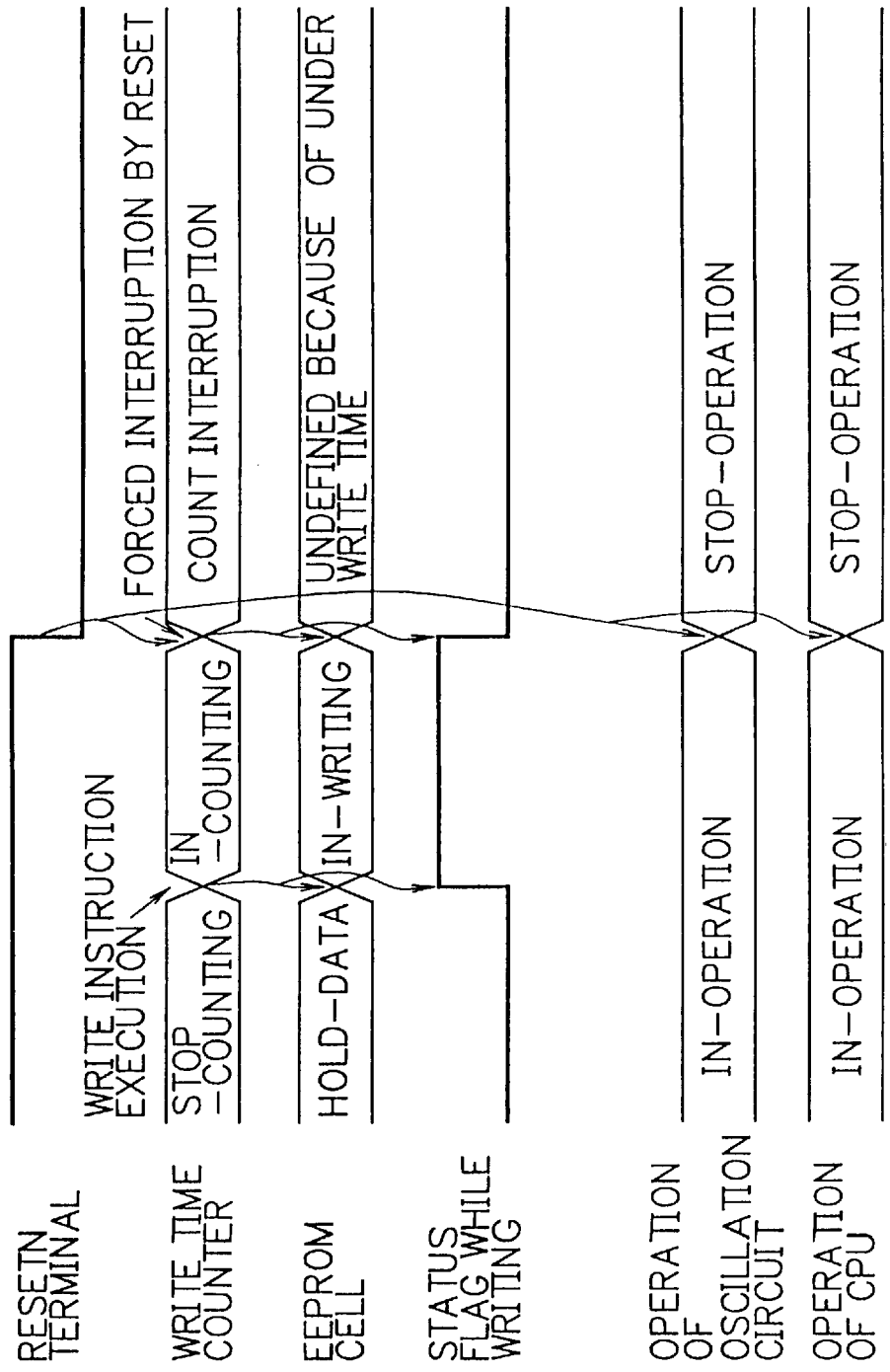
FIG. 2 is a timing chart showing the resetting method of FIG. 1.
Figure 3:
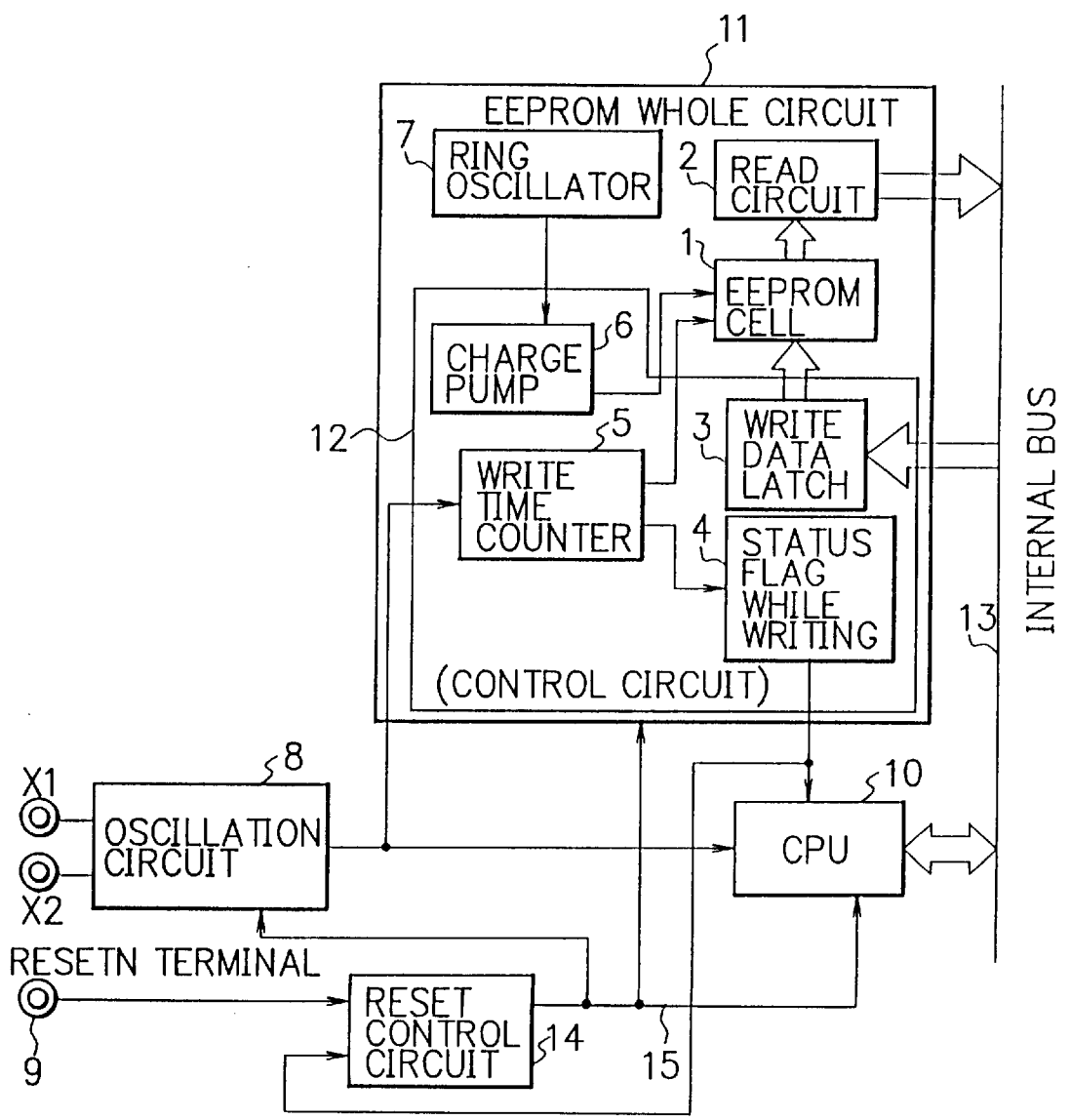
FIG. 3 is a block diagram showing a conventional method of resetting a system.
Figure 4:
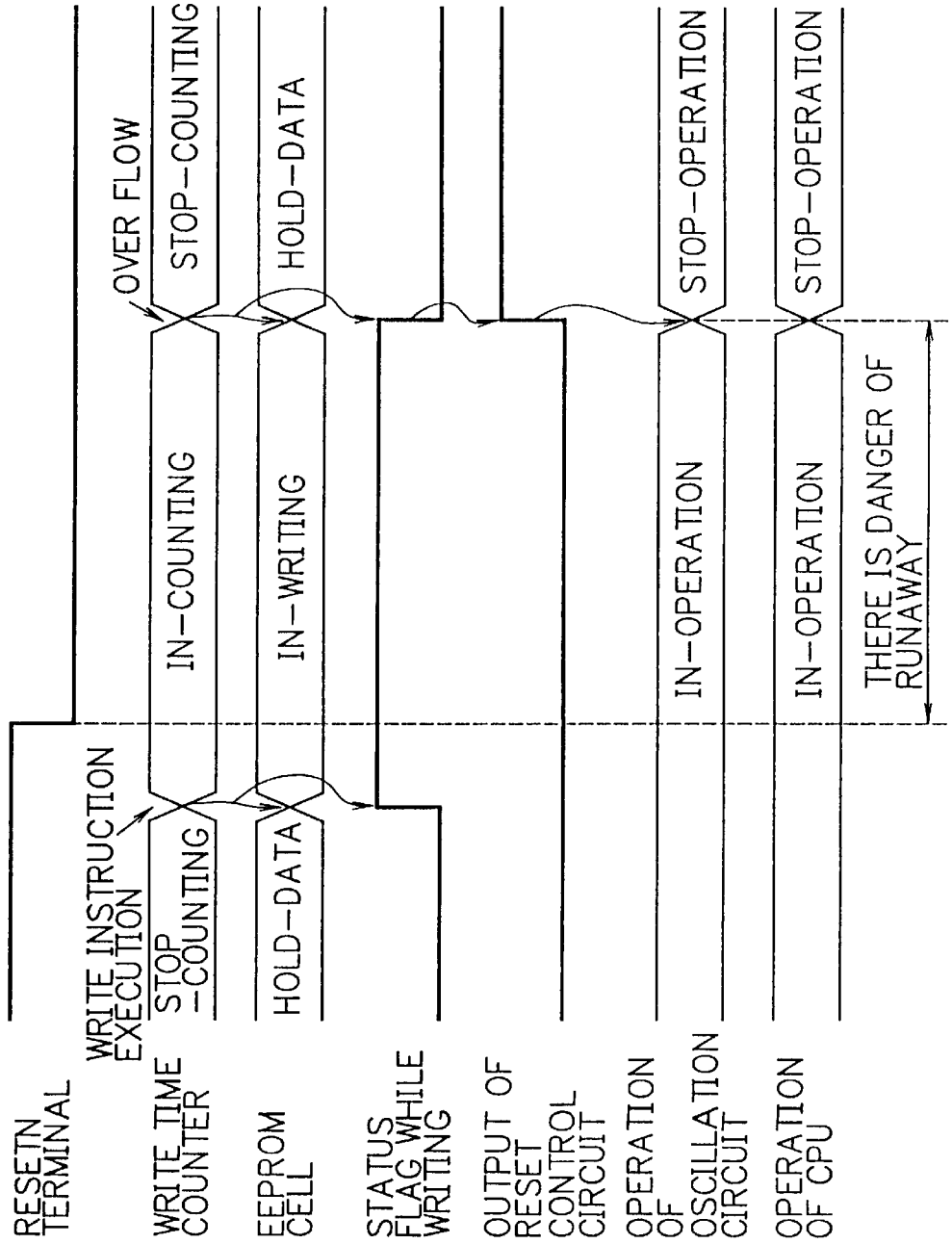
FIG. 4 is a timing chart showing the resetting method of FIG. 3.
Figure 5:
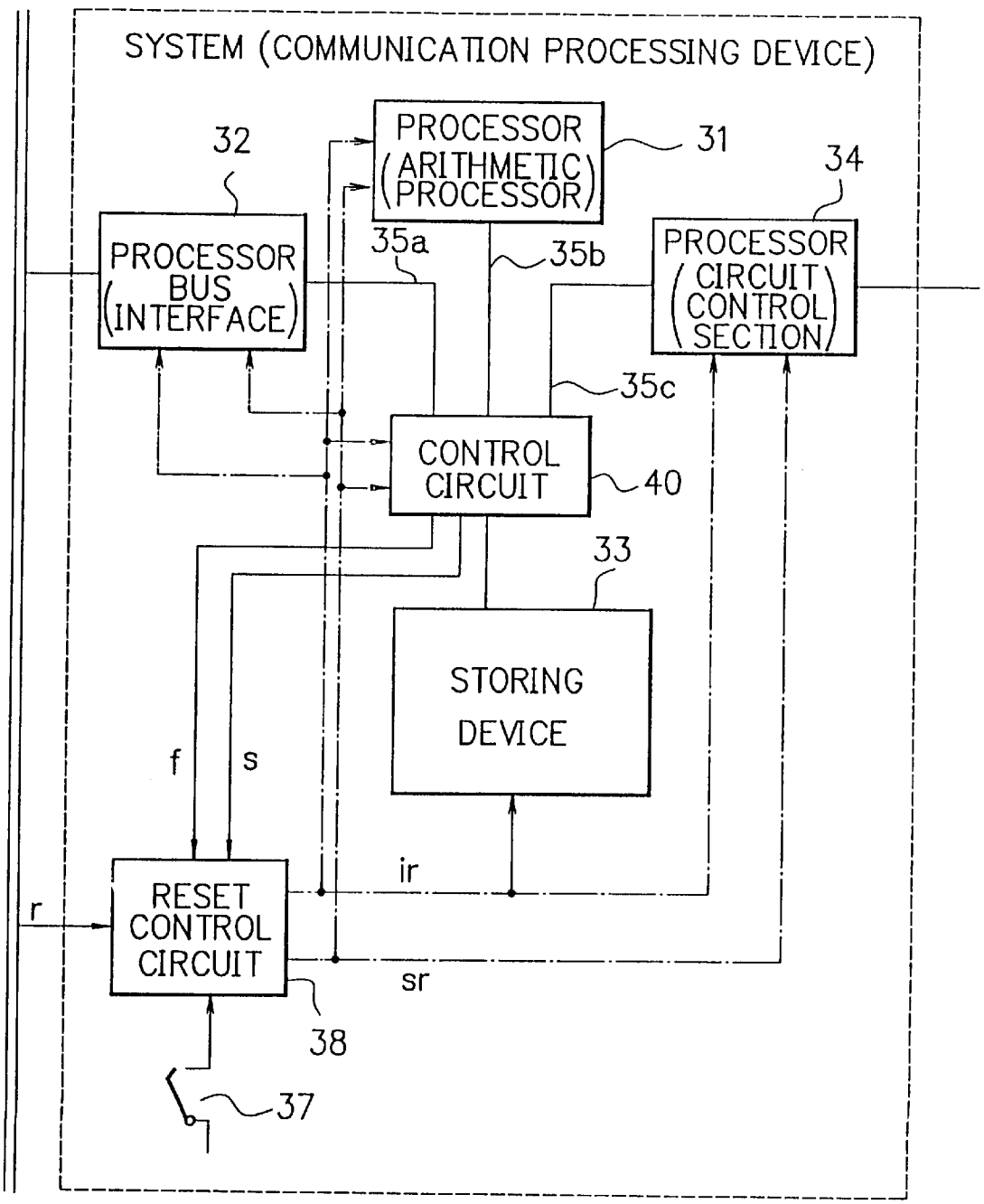
FIG. 5 is a block diagram showing the communication processing device disclosed in the Japanese Patent Application Laid-Open No. HEI 2-210515.
Figure 7:
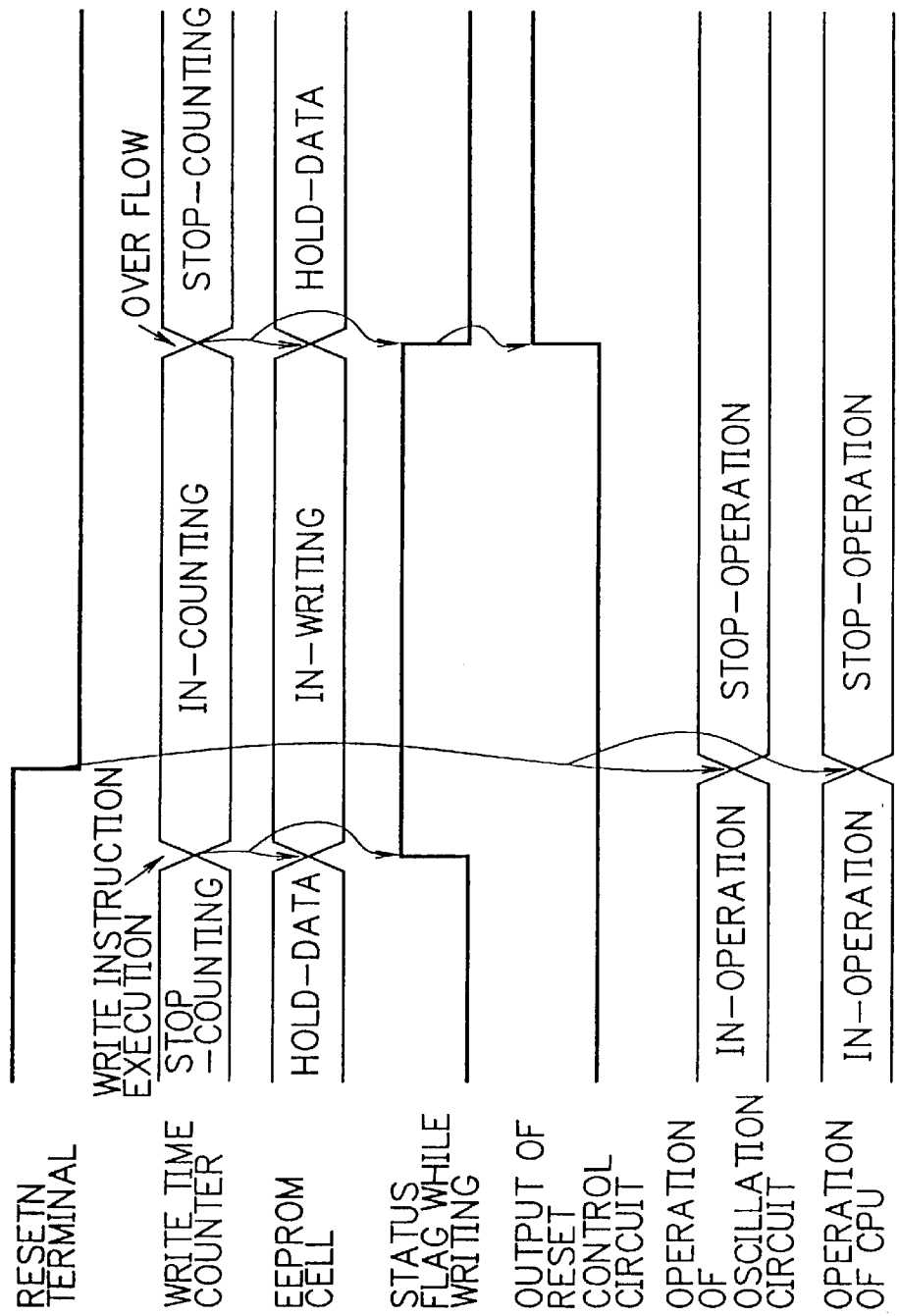
FIG. 7 is a timing chart showing operation of the first embodiment.

A preferred embodiment of the present invention will now be described in detail referring to the accompanying drawings. FIG. 6 is a block diagram showing the first embodiment of the resetting method of the present invention, and FIG. 7 is a timing chart showing operation of the first embodiment.

The resetting method shown in FIG. 6 comprises an EEPROM whole circuit 11, an oscillation circuit 8, a CPU 10, a RESETN terminal 9 and a reset control circuit 14. The EEPROM whole circuit 11 includes a ring oscillator 7, a read-out circuit 2, an EEPROM cell 1, and a control circuit 12. Further the control circuit 12 includes a charge pump 6, a write time counter 5, a write data latch 3 and a status flag while writing 4.

When the EEPROM write instruction is executed, data of the internal bus 13 is latched within the write data latch 3. Further, the write time counter 5 starts counting. Simultaneously, the ring oscillator 7 starts oscillation. The data is latched within the write data latch 3, before writing operation of the value of the write data latch 3 toward the EEPROM cell 1 is started. The clock of the write time counter 5 is set to a clock of the ring oscillator 7. The charge pump 6 generates the voltage which is required for the writing of the EEPROM cell 1 depending on the clock from the ring oscillator 7. The status flag-while writing 4 outputs HIGH-LEVEL during the period when the write time counter 5 is operating, thus exhibiting that the EEPROM is in the writing state.

Even if the reset signal is received from the RESETN terminal 9 while the EEPROM is in the writing state, since the status flag-while writing 4 is of the HIGH-LEVEL, output 15 of the reset control circuit 14 maintains LOW LEVEL. The reset does not operate on the EEPROM whole circuit 11 until the status flag-while writing 4 comes into LOW-LEVEL while completing the counting of the write time counter 5, and while terminating the writing of the EEPROM cell 1. The CPU 10 and the oscillation circuit 8 are affected by the reset at the time when the reset signal is received from the RESETN terminal 9.

In the present embodiment, the writing of the EEPROM is of no-problem even if the CPU 10 halts, because the writing is implemented only at the EEPROM whole circuit 11 after the value of the internal bus 13 is latched within the write data latch 3. Further, since the write time counter 5 which counts the write time of the EEPROM halts, the writing of the EEPROM itself is obliged to halt, the clock of the write time counter 5 is constituted not so as to halt.

Figure 8:
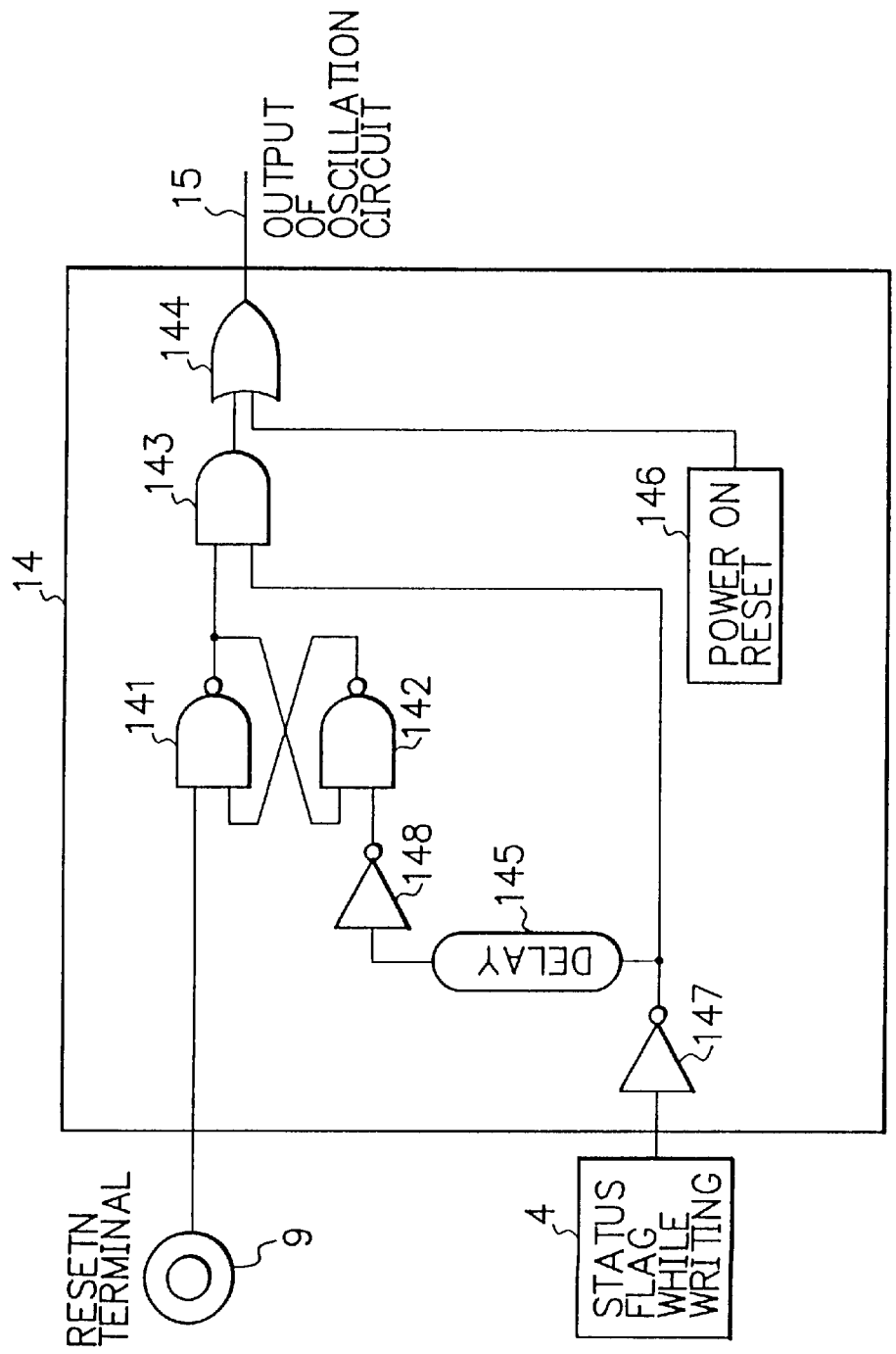
FIG. 8 is a view showing one example of a resetting control circuit of the first embodiment.

FIG. 8 is a view showing one example of the reset control circuit 14 of the first embodiment. The reset control circuit 14 comprises a power on reset 148 for initializing the EEPROM whole circuit 11, a delay 145, an INV circuit 147 for inverting the status flag-while writing, NAND circuits 141, and 142 for latching the reset signal from the RESETN terminal 9, and an OR circuit 144.

The power on reset 148 causes an initial-value of the status flag-while 4 to be LOW-LEVEL. When the status flag-while writing is of the LOW-LEVEL, namely, when the EEPROM is not in the writing state and the reset signal of LOW-LEVEL ACTIVE from the RESETN terminal is received, the output of the NAND circuit 141 comes into HIGH-LEVEL, the output of the AND circuit 143 comes into HIGH-LEVEL, and the output 15 of the reset control circuit 14 comes into HIGH-LEVEL, thus only the EEPROM whole circuit 11 is affected by the reset while the reset signal is not of the hold state.

When the status flag-while writing 4 is of the HIGH-LEVEL, namely when the reset signal of the low level active is received from the RESETN terminal 9 while the EEPROM is of the writing state, the output of the AND circuit 143 maintains LOW-LEVEL because although the output of the NAND circuit 141 comes into HIGH-LEVEL, another input of the AND circuit 143 is of the LOW-LEVEL. Since the output 15 of the reset control circuit maintains the LOW-LEVEL, the reset signal is held, the operation of the EEPROM whole circuit 11 continues.

When the status flag-while writing 4 is of the HIGH-LEVEL, namely, the writing of the EEPROM is during execution, although the RESETN terminal 9 comes into HIGH-LEVEL from the LOW-LEVEL ACTIVE, the output of the NAND circuit 141 maintains HIGH-LEVEL. When the status flag-while writing 4 changes into LOW-LEVEL, namely, the writing of the EEPROM is completed, the output of the AND circuit 143 comes into HIGH-LEVEL, and the output 15 of the reset control circuit comes into HIGH-LEVEL, thus the reset operates on the EEPROM whole circuit 11. After elapsing the time established by the delay 145, the output of the NAND circuit 141 comes into HIGH-LEVEL, and the output the AND circuit 143 comes into LOW-LEVEL, so that the output 15 of the reset control circuit comes into LOW-LEVEL. Namely, only during the period established by the delay 145, the output 15 of the reset control circuit comes into HIGH-LEVEL.

Figure 9:
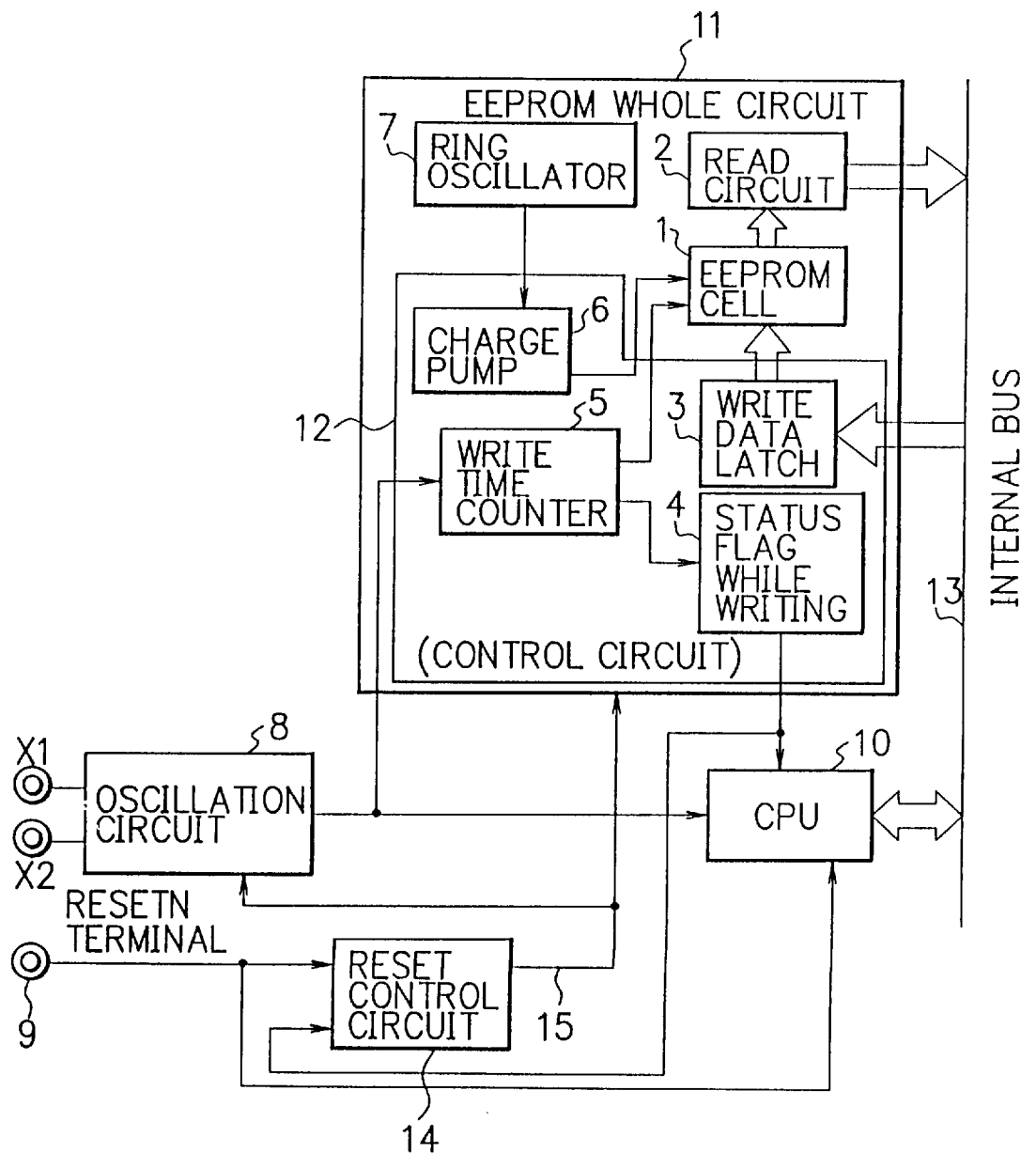
FIG. 9 is a block diagram showing a second embodiment of a resetting method of the present invention.

Next, a second embodiment according to the present invention will be described referring to the drawings. FIG. 9 is a block diagram showing the second embodiment of the resetting method of the present invention, and FIG. 10 is a timing chart showing operation of the second embodiment.

The resetting method shown in FIG. 9 comprises an EEPROM whole circuit 11, an oscillation circuit 8, a CPU 10, a RESETN terminal 9, and a reset control circuit 14. The EEPROM whole circuit 11 includes a ring oscillator 7, a read-out circuit 2, an EEPROM cell 1, and a control circuit 12. Further, the control circuit 12 includes a charge pump 6, a write time counter 5, a write data latch 3, and a status flag-while writing 4.

When the EEPROM write instruction is executed, the data of the internal bus 13 is latched within the write data latch 3. The write time counter 5 starts the counting. Simultaneously, the ring oscillator 7 starts oscillation. The data is latched within the write data latch 3, before starting a writing operation of the value of the write data latch 3 to the EEPROM cell 1. The clock of the write time counter 5 is set to the clock of the oscillation circuit 8. The charge pump 6 generates the voltage necessary for the writing of the EEPROM cell 1 depending on the clock from the ring oscillator 7. The status flag-while writing 4 outputs HIGH-LEVEL during the period when the write time counter is operating, thus exhibiting that the EEPROM is of the writing state.

Even if the reset signal is taken in from the RESETN terminal 9 while the EEPROM is of the writing state, since the status flag-while writing 4 is of the high level, output 15 of the reset control circuit 14 maintains LOW LEVEL. The reset does not operate on the EEPROM whole circuit 11 and the oscillation circuit 8 until the status flag-while writing 4 comes into LOW-LEVEL, by completing the counting of the write time counter 5, and by terminating the writing of the EEPROM cell 1. The CPU 10 is affected by the reset at the time when the reset signal is received from the RESETN terminal 9.

As described above, according to the present embodiment, when the reset signal is received because of a power failure during writing of the EEPROM, it is capable of implementing the writing of the EEPROM to the end normally, and it is capable of avoiding runaway of the whole system.

The micro computer internally stored EEPROM for monitor will be explained by way of one embodiment. When the user adjusts brightness of a screen while the EEPROM is of the writing state, in order to maintain the established state nevertheless disconnecting the power source, the value of the RAM after screen brightness adjusting is stored in the EEPROM. When the system reset occurs caused by the power failure while the EEPROM is in the writing state, there is dangerousness that runaway of the CPU occurs when the reset of the CPU is held while the EEPROM is in the writing state. There is implemented DA conversion due to the PWM output outputted from the micro processor, thus designing the power source circuit of the voltage causing the horizontal screen size to be changed. When assuming that the PWM duty of the micro computer is of the 50%±10% to the normal state, there is dangerousness that the power source circuit is broken caused by the fact that the duty of PWM comes into 90%–10% due to the runaway of the micro computer. The present invention is capable of avoiding such problem.

As described above, according to the first embodiment of the present invention, when the reset signal is received because of a power failure while the EEPROM is in the writing state, the method includes the steps of detecting whether or not the EEPROM is in the writing state, subsequently when the EEPROM is in the writing state, causing only the reset of writing operation of the EEPROM to be suspended until termination of the writing operation, and causing the reset without writing operation of the storing device to be held, thus there is effect that the EEPROM writing is implemented to the end normally, and it is capable of avoiding the runaway of the whole system.

Further, in the first embodiment, since the clock of the write time counter 5 is the output of the ring oscillator 7, when the cycle of the ring oscillator changes accompanying with fluctuation of power source voltage, write time of the EEPROM changes. For this reason, it is incapable of being applied to an application whose power source voltage is fluctuated. However, in the second embodiment, since the clock of the write time counter 5 is the output of the oscillation circuit 8, the write time of the EEPROM does not change even if the power source voltage is fluctuated. For this reason, the second embodiment applies to the application in which the power source voltage is fluctuated.

While preferred embodiments of the invention have been described using specific terms, such description is for illustrative purpose only, and it is to be understood that changes and variations may be made without departing from the spirit or scope of the following claims.

What is claimed is:

1. A method of resetting a system including a CPU, a storing device, an oscillation circuit and a reset control. circuit, said resetting method comprising the steps of:

detecting a writing operation of said storing device at the time when a system reset signal occurs by means of said reset control circuit; and holding a reset of said storing device until the writing operation of said storing device is terminated when said storing device is implementing the writing operation at the time a reset signal is received, while implementing at least a reset of said CPU.

2. A method of resetting a system as claimed in claim 1, wherein said storing device includes an EEPROM (electrically erasable programmable read-only memory).

3. A method of resetting a system as claimed in claim 1, wherein there is implemented a detection of the writing operation of said storing device by a status circuit of said storing device.

4. A method of resetting a system as claimed in claim 1, wherein there is implemented continuation of the writing operation of said storing device by either a ring oscillator or an oscillation circuit.

5. A method of resetting a system including a CPU, a storing device, an oscillation circuit and a reset control circuit, said resetting method comprising the steps of:

detecting a writing operation of said storing device at the time when a system reset signal occurs by means of said reset control circuit; and holding a reset of said storing device and said oscillation circuit until the writing operation of said storing device is terminated when said storing device is implementing the writing operation, at the time a reset signal is received, while implementing at least a reset of said CPU.

* * * * *